(12) United States Patent
Stolfi et al.

(10) Patent No.: US 11,508,828 B2
(45) Date of Patent: Nov. 22, 2022

(54) SELECTIVE SILICON ETCH FOR GATE ALL AROUND TRANSISTORS

(71) Applicant: Applied Materials, Inc., Santa Clara, CA (US)

(72) Inventors: Michael Stolfi, Clifton Park, NY (US); Myungsun Kim, Pleasanton, CA (US); Benjamin Colombeau, San Jose, CA (US); Sanjay Natarajan, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 17/354,251

(22) Filed: Jun. 22, 2021

(65) Prior Publication Data

US 2022/0005937 A1    Jan. 6, 2022

Related U.S. Application Data

(60) Provisional application No. 63/048,404, filed on Jul. 6, 2020.

(51) Int. Cl.
*H01L 29/66* (2006.01)
*H01L 29/06* (2006.01)
*H01L 29/423* (2006.01)
*H01L 27/088* (2006.01)

(52) U.S. Cl.
CPC .... *H01L 29/66439* (2013.01); *H01L 29/0673* (2013.01); *H01L 29/42392* (2013.01); *H01L 27/088* (2013.01)

(58) Field of Classification Search
CPC .......... H01L 29/66439; H01L 29/0673; H01L 29/42392
See application file for complete search history.

(56) References Cited

U.S. PATENT DOCUMENTS

| | | | |
|---|---|---|---|
| 9,460,920 B1 | 10/2016 | Sun et al. | |
| 9,484,406 B1 | 11/2016 | Sun et al. | |
| 9,673,277 B2 | 6/2017 | Brand et al. | |
| 10,269,571 B2 | 4/2019 | Wong et al. | |
| 10,332,881 B1 | 6/2019 | Badaroglu et al. | |
| 2016/0336405 A1* | 11/2016 | Sun | H01L 29/42392 |
| 2017/0194430 A1* | 7/2017 | Wood | H01L 29/0673 |
| 2020/0152493 A1 | 5/2020 | Colombeau et al. | |

FOREIGN PATENT DOCUMENTS

| | | |
|---|---|---|
| KR | 20160136292 A | 11/2016 |
| KR | 20170009669 A | 1/2017 |
| WO | 2019112952 A1 | 6/2019 |

OTHER PUBLICATIONS

PCT International Search Report and Written Opinion in PCT/US2021/039052 dated Oct. 21, 2021, 10 pages.

* cited by examiner

*Primary Examiner* — Changhyun Yi
(74) *Attorney, Agent, or Firm* — Servilla Whitney LLC

(57) ABSTRACT

Horizontal gate-all-around devices and methods of manufacturing same are described. The hGAA devices comprise a trimmed semiconductor material between source regions and drain regions of the device. The method includes selectively isotropically etching semiconductor material layers between source regions and drain regions of an electronic device.

14 Claims, 6 Drawing Sheets

SELECTIVE SILICON ETCH FOR GATE ALL AROUND TRANSISTORS

CROSS-REFERENCE TO RELATED APPLICATIONS

This application claims priority to U.S. Provisional Application Ser. No. 63/048,404, filed Jul. 6, 2020, the entire disclosure of which is hereby incorporated by reference herein.

TECHNICAL FIELD

Embodiments of the present disclosure generally relate to semiconductor devices and more particularly to horizontal gate all around device structures and methods and apparatus for forming horizontal gate all around device structures.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

Logic gate performance is related to the characteristics of the materials used as well as the thickness and area of the structural layers. However, as some gate characteristics are adjusted to accommodate device scaling, challenges arise. Furthermore, the space confinement between wires on a horizontal gate-all-around (hGAA) device limits the thickness of the gate dielectric material for I/O transistors.

Complementary metal-oxide-semiconductor (CMOS) devices need to be fabricated with multiple threshold voltages for logic applications. Threshold voltage tuning is typically performed by depositing and etching different metal films on the gate dielectric. Additionally, as device dimension shrink and device architecture changes to the gate all around design, there is less physical space for film deposition and etching.

Accordingly, there is a need for improved methods for forming horizontal gate-all-around devices.

SUMMARY

One or more embodiments of the disclosure are directed to methods of forming a semiconductor device. In one or more embodiments, a method of forming a semiconductor device comprises: pre-cleaning a plurality of semiconductor material layers to remove native oxide and/or residues; and trimming the plurality of semiconductor material layers to form trimmed semiconductor material layers.

Additional embodiments of the disclosure are directed to horizontal gate-all-around devices. In one or more embodiments, a horizontal gate-all-around device comprises a plurality of horizontal trimmed semiconductor material layers between a source region and a drain region.

Further embodiments of the disclosure are directed to computer readable medium. In one or more embodiments, a non-transitory computer readable medium includes instructions, that, when executed by a controller of a processing chamber, causes the processing chamber to perform the operations of: pre-clean a plurality of semiconductor material layers to remove native oxide and/or residues; and trim the plurality of semiconductor material layers to form trimmed semiconductor material layers

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
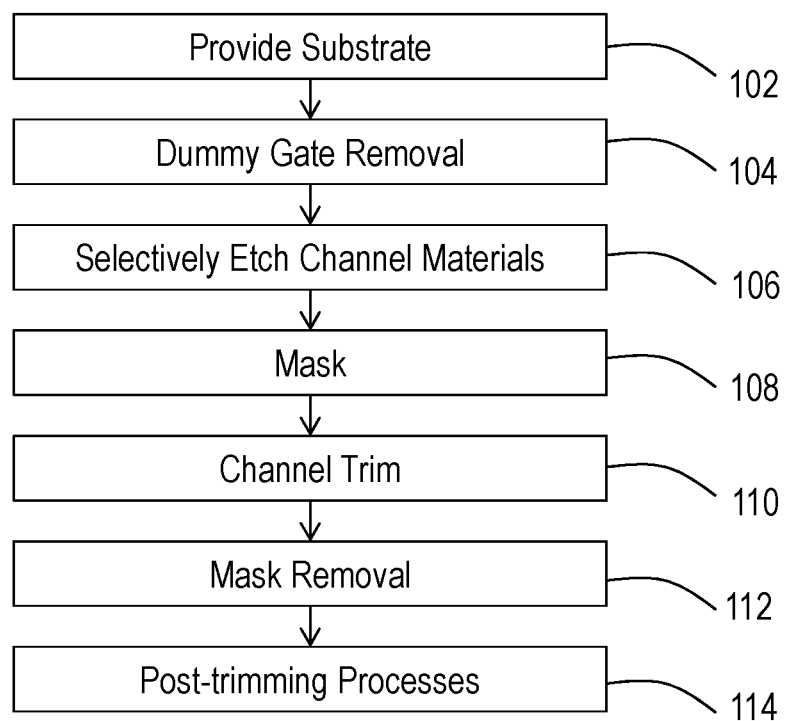
FIG. 1 illustrates a process flow diagram of a method for forming a semiconductor device in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated VDS. By applying voltage to gate (G), the current entering the channel at the drain (i.e. ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g. a transistor, in which the gate material surrounds the channel region on all sides. The channel region of a GAA transistor may include nano-wires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g. DRAM) and non-volatile (e.g. NAND) devices.

In one or more embodiments, a horizontal gate-all-around (hGAA) transistor comprises a substrate having a top surface; a source region having a source and a source contact, the source region on the top surface of the substrate; a drain region having a drain and a drain contact, the drain region on the top surface of the substrate; a channel located between the source and the drain and having an axis that is substantially parallel to the top surface of the substrate; a gate enclosing the channel between the source region and the drain region; a dielectric layer overlying and in contact with one or more of the gate, the source contact, or the drain contact, and a gate spacer overlying the dielectric layer. In one or more embodiments, the spacer layer has a thickness less than about 8 nm.

One or more embodiments of the disclosure are directed to methods of forming horizontal gate-all-around devices. Some embodiments advantageously provide methods to adjust the threshold voltage of the device without requiring deposition and etching of metal films. In some embodiments, the thickness and width of silicon nano-slabs that are used as the channel for the GAA transistor are advantageously reduced. The method of one or more embodiments includes pre-cleaning of the silicon surface as well as silicon etching without breaking vacuum.

The method of one or more embodiments advantageously does not require deposition and etch to adjust the threshold voltage. Additionally, oxidation of the silicon, and removal of the oxidized silicon, which could increase the dielectric constant (k value) of surrounding spacer materials and degrade the device performance is not required in the method of one or more embodiments. In some embodiments, if the gate all-around transistors are formed using a Si/SiGe superlattice, decreasing the starting silicon layer thickness could result in loss of process control due to Ge diffusion into the silicon during subsequent processing. Accordingly, in the method of one or more embodiments, the thickness of the deposited silicon layer in the Si/SiGe superlattice, which is required to fabricate GAA transistors, does not need to be changed.

In the method of one or more embodiments, gate all-around transistors are fabricated using a standard process flow. After the channel release, where the sacrificial silicon germanium (SiGe) epitaxial layers are removed to expose all sides of the silicon nano-slab, the substrate is masked to expose only certain portions of the substrate for selective nano-slab trimming. In one or more embodiments, the substrate undergoes an optional first pre-clean to remove organic residues. Subsequently, the substrate is subjected to a second pre-clean to remove native oxides, e.g. silicon oxide (SiOx), at the interface of the silicon nano-slab. The substrate is then subjected to a silicon etch to reduce the nano-slab thickness and width.

The embodiments of the disclosure are described by way of the Figures, which illustrate devices (e.g. transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram for a method 100 for forming a semiconductor device in accordance with some embodiments of the present disclosure. The method 100 is described below with respect to FIGS. 2A-2I, which depicts the stages of fabrication of semiconductor structures in accordance with some embodiments of the present disclosure. FIGS. 2A-2I are cross-sectional views of an electronic device (e.g. a hGAA) according to one or more embodiments. The method 100 may be part of a multi-step fabrication process of, a semiconductor device. Accordingly, the method 100 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figures 2A, 2B:
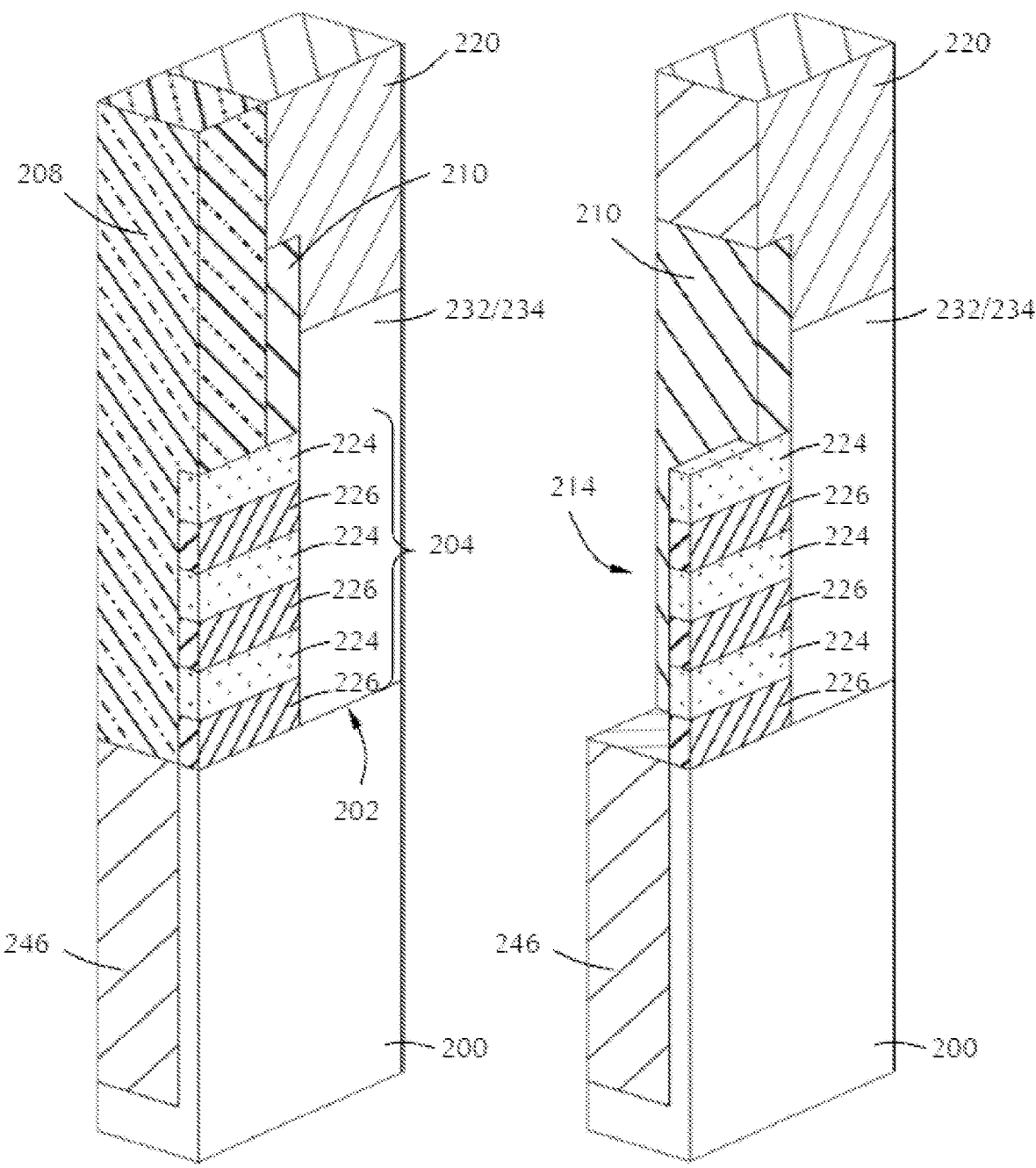
FIGS. 2A-2I illustrate stages of fabrication of a substrate during a method of forming a semiconductor device in accordance with some embodiments of the present disclosure.

The method 100 begins at operation 102, by providing a substrate 200 having a top surface 202 (as illustrated in FIG. 2A). In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the surface of the substrate 200 in order to prevent parasitic bottom device turn on. In one or more embodiments, a superlattice structure 204 is formed atop the first location. For example, in some embodiments, the surface of the substrate may have a dopant density about $10^{18}$ atoms/cm$^3$ to about $10^{19}$ atoms/cm$^3$.

At least one superlattice structure 204 is formed atop the top surface 202 of the substrate 200 (as depicted in FIG. 2A). The superlattice structure 204 comprises a plurality of semiconductor material layers 224 and a corresponding plurality of release layers 226 alternatingly arranged in a plurality of stacked pairs. In some embodiments the plurality of stacked groups of layers comprises a silicon (Si) and silicon germanium (SiGe) group. In some embodiments, the plurality of semiconductor material layers 224 and corresponding plurality of release layers 226 can comprise any number of lattice matched material pairs suitable for forming a superlattice structure 204. In some embodiments, the plurality of semiconductor material layers 224 and corresponding plurality of release layers 226 comprise from about 2 to about 50 pairs of lattice matched materials.

Typically, a parasitic device will exist at the bottom of the superlattice structure 204. In some embodiments, implantation of a dopant in the substrate, as discussed above, is used to suppress the turn on of the parasitic device. In some embodiments, the substrate 200 is etched so that the bottom portion of the superlattice structure 204 includes a substrate portion which is not removed, allowing the substrate portion to act as the bottom release layer of the superlattice structure 204.

In one or more embodiments, the thicknesses of the semiconductor material layers 224 and release layers 226 in some embodiments are in the range of from about 2 nm to about 50 nm, in the range of from about 3 nm to about 20 nm, or in a range of from about 2 nm to about 15 nm. In some embodiments, the average thickness of the semiconductor material layers 224 is within 0.5 to 2 times the average thickness of the release layers 226.

In some embodiments, a dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

In some embodiments, a replacement gate structure (e.g., a dummy gate structure 208) is formed over and adjacent to the superlattice structure 204. The dummy gate structure 208 defines the channel region of the transistor device. The dummy gate structure 208 may be formed using any suitable conventional deposition and patterning process known in the art.

In some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low pressure chemical vapor deposition.

In some embodiments, the embedded source region 232 and drain region 234 form in a source trench and a drain trench, respectively. In some embodiments, the source region 232 is formed adjacent a first end of the superlattice structure 204 and the drain region 234 is formed adjacent a second, opposing end of the superlattice structure. In the embodiment illustrated in FIG. 2A, one of the source region 232 or drain region 234 is not shown at the front face of the superlattice structure 204. The other end of the superlattice structure 204 has the other of the source region 232 or drain region 234. In some embodiments, the source region 232 and/or drain region 234 are formed from any suitable semiconductor material, such as but not limited to silicon, germanium, silicon germanium, or the like. In some embodiments, the source region 232 and drain region 234 may be formed using any suitable deposition process, such as an epitaxial deposition process.

In some embodiments, an inter-layer dielectric (ILD) layer 220 is blanket deposited over the substrate 200, including the source/drain regions 232, 234, the dummy gate structure 208, and the sidewall spacers 210. The ILD layer 220 may be deposited using a conventional chemical vapor deposition method (e.g., plasma enhance chemical vapor deposition and low pressure chemical vapor deposition). In one or more embodiments, ILD layer 220 is formed from any suitable dielectric material such as, but not limited to, undoped silicon oxide, doped silicon oxide (e.g., BPSG, PSG), silicon nitride, and silicon oxynitride. In one or more embodiments, ILD layer 220 is then polished back using a conventional chemical mechanical planarization method to expose the top of the dummy gate structure 208. In some embodiments, the ILD layer 220 is polished to expose the top of the dummy gate structure 208 and the top of the sidewall spacers 210.

In operation 104, as shown in FIG. 2B, the dummy gate structure 208 is removed to expose the channel region 214 of the superlattice structure 204. The ILD layer 220 protects the source/drain regions 232, 234 during the removal of the dummy gate structure 208. The dummy gate structure 208 may be removed using any conventional etching method such as a plasma dry etch or a wet etch. In some embodiments, the dummy gate structure 208 comprises poly-silicon and the dummy gate structure 208 is removed by a selective etch process. In some embodiments, the dummy gate structure 208 comprises poly-silicon and the superlattice structure 204 comprises alternating layers of silicon (Si) and silicon germanium (SiGe).

Figure 2C:
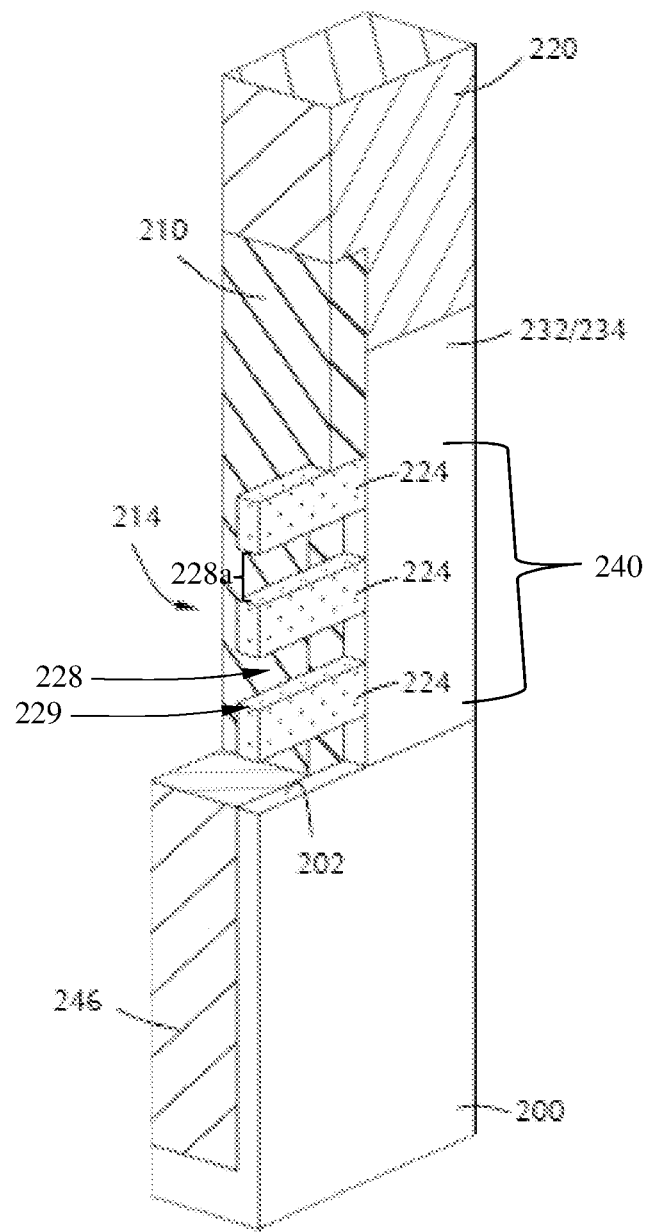

In operation 106, as shown in FIG. 2C, the release layers 226 are selectively etched between the semiconductor material layers 224 in the superlattice structure 204. In one or more embodiments, an isotropic etch is performed on the release layers 226 to form one or more cavities 228 between the semiconductor material layers 224. As shown in FIG. 2C, each cavity 228 has a surface 229. Furthermore, each cavity 228 is disposed between an existing structure of the device (i.e. one of the sidewall spacers 210) and the bulk semiconductor portion of the semiconductor substrate 200. Consequently, portions of cavities 228 are each in a region that is inaccessible to a line-of-sign ion implantation technique.

The isotropic etch process of operation 106 may be selected to remove sufficient material from superlattice structure 204 so that cavity 228 has any suitable target width 228a. For example, in some embodiments, the isotropic etch process of operation 106 is performed so that cavity 228 has a target width of 228a of about 2 nm to about 10 nm. In other embodiments, cavity 228 bounded by surface 229 may have a target width 228a of more than 10 nm or less than 2 nm, depending on the geometry of sidewall spacers 210, the concentration of n-dopants or p-dopants in heavily doped regions, and other factors. For example, in some embodiments, target width 228a may be selected so that cavities 228 have a target width 228a of no more than about 1 nm less than width sidewall spacers 210.

The isotropic etch process of operation 106 may include any suitable etch process that is selective to the semiconductor material of the release layers 226. In some embodiments the isotropic etch process of operation 106 comprises one or more of a wet etch process or a dry etch process. In some embodiments, the isotropic etch process of operation 106 comprises a dry etch process.

In one or more embodiments, where the superlattice structure 204 is composed of silicon layers and silicon germanium layers, the silicon germanium is selectively etched to form channel nanowires 240. The release layers 226, for example silicon germanium, may be removed using any well-known etchant that is selective to the layers of the semiconductor material layers 224 where the etchant etches the layers of release layers 226 at a significantly higher rate than the layers of semiconductor material layers 224. In some embodiments, a selective dry etch or wet etch process may be used. The removal of the release layers 226 leaves voids 228 between the semiconductor material layers 224. The voids 228 between the semiconductor material layers 224 have a thickness of about 3 nm to about 20 nm. The remaining semiconductor material layers 224 form a vertical array of channel nanowires 240 that are coupled to the source/drain regions 232, 234. The channel nanowires 240 run parallel to the top surface 202 of the substrate 200 and are aligned with each other to form a single column of channel nanowires 240. The formation of the source region 232 and drain region 234 and the formation of an optional lateral etch stop layer (not shown) advantageously provide self-alignment and structural integrity in the formation of the channel structure.

Figure 2D:
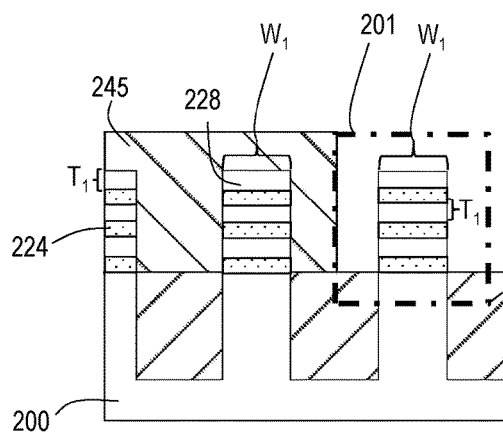
Figure 2F:
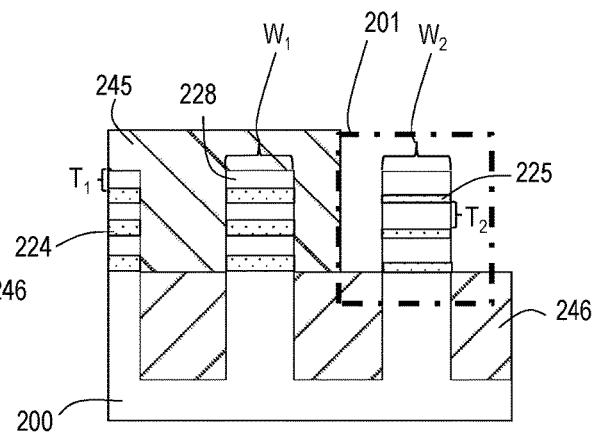
Figure 2E:
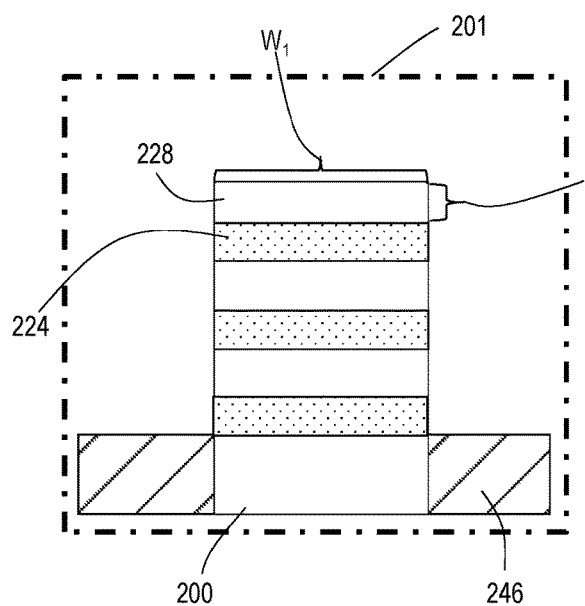
Figure 2G:
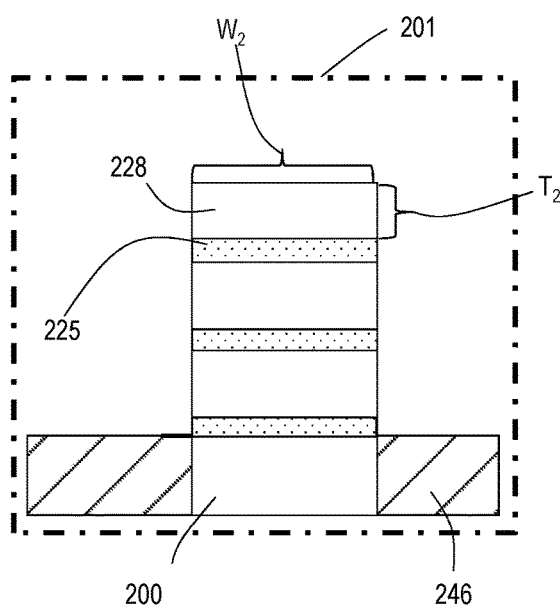

In operation 108, as illustrated in FIG. 2D, regions of the substrate 200 are masked 245 to leave exposed semiconductor material layers 224 in only certain portions or areas of the substrate for selective silicon channel trimming. The substrate may be masked using any suitable technique known to the skilled artisan. The substrate may be masked with any suitable mask material known to the skilled artisan.

In some embodiments, an optional operation pre-trimming cleaning process or other surface preparation process is performed on surface 229 of cavity 228. The surface preparation process may be performed to remove native oxide on surface 229 and to otherwise prepare surface 229 prior to a process performed in operation 110. The surface preparation process may include a dry etch process, a wet etch process, or a combination of both.

In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, surface 229 are exposed to $H_2$, $NF_3$, and/or $NH_3$ plasma species, e.g., plasma-excited hydrogen and fluorine species. For example, in some embodiments, surface 229 may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called "HF last" process, in which HF etching of surface 229 is performed that leaves surface 229 hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

In some embodiments, the apparatus or process tool is configured to maintain the substrate under vacuum conditions to prevent formation of an oxide layer after the pre-trimming cleaning process. In embodiments of this sort, the process tool is configured to move the substrate from a pre-trimming cleaning chamber to an etch process chamber without exposing the substrate to atmospheric conditions.

In one or more embodiments, in operation 110, the channel nanowires 240 are trimmed via an isotropic etch process performed on the semiconductor material layers 224. The isotropic etch process of one of more embodiments increases the vertical thickness/width of the cavities 228 and decreases the horizontal width of the semiconductor material layers 224. As illustrated in FIG. 2C, each cavity 228 has a surface 229. Furthermore, each cavity 228 is disposed between an existing structure of the device (i.e. one of the sidewall spacers 210) and the bulk semiconductor portion of the semiconductor substrate 200.

The isotropic etch process of operation 110 may be selected to remove sufficient material from semiconductor material layers 224 so that cavity 228 increases in size and has a suitable target thickness $T_2$. For example, in some embodiments, the isotropic etch process of operation 110 is performed so that cavity 228 increases from a first thickness, $T_1$ (in FIGS. 2D and 2E), to a second thickness, $T_2$ (in FIGS. 2F and 2G). As used herein, the term "thickness" refers to the vertical distance of the cavity 228 as defined by two semiconductor material layers 224. In one or more embodiments, the first thickness, $T_1$, of the cavity 228 is in a range of from about 5 nm to about 15 nm, and the width, $W_1$, of the semiconductor material layers 224 prior to trimming is a range of from about 3 nm to about 20 nm.

In one or more embodiments, after trimming at operation 110, the thickness of the cavity 228 increases to a second thickness, $T_2$, in a range of from about 6 nm to about 20 nm. After trimming at operation 110, the width, $W_2$, of the semiconductor material layers 224 is a range of from about 3 nm to about 10 nm. Accordingly, in one or more embodiments, trimming increases the thickness of the cavity 228 and decreases the width of the semiconductor material layers 224.

The isotropic etch process of operation 110 may include any suitable etch process that is selective to the semiconductor material layers 224. For example, the trimming process can be completed using the Selectra™ etch chamber available from Applied Materials®. In some examples the trimming process includes nitrogen trifluoride ($NF_3$), a mixture of nitrogen trifluoride and helium (He) or a similar process chemistry.

In one or more embodiments, at operation 112, the mask 245 is removed. The mask may be removed using any suitable technique known to the skilled artisan.

Figures 2H, 2I:
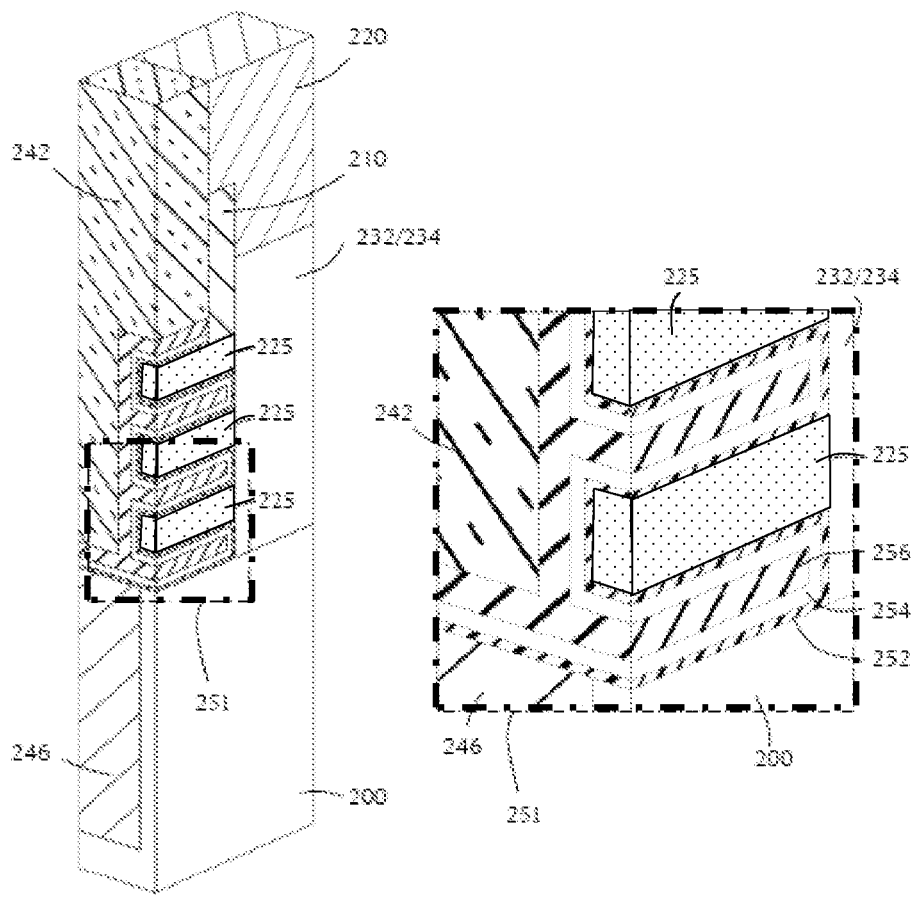

In one or more embodiments, operation 112 of method 100 represents one or more post-trimming processing operations. The one or more post-trimming processes can by any of the processes known to the skilled artisan for completion of the hGAA device. Referring to FIGS. 2H and 2I, in some embodiments, an oxide layer 252 is formed or grown on the trimmed semiconductor material layers 224. The oxide layer 252 can be any suitable oxide formed by any suitable technique known to the skilled artisan.

In the illustrated embodiment, a high-k dielectric 254 is formed on the oxide layer 252. The high-k dielectric 254 can be any suitable high-k dielectric material deposited by any suitable deposition technique known to the skilled artisan. The high-k dielectric 254 of some embodiments comprises hafnium oxide. In some embodiments, a conductive material 256 such as titanium nitride (TiN), tungsten (W), cobalt (Co), aluminum (Al), or the like is deposited on the high-k dielectric 254. The conductive material 256 may be formed using any suitable deposition process such as, but not limited to, atomic layer deposition (ALD) in order to ensure the formation of a layer having a uniform thickness around each of the doped semiconductor material layer 245.

In some embodiments, a gate electrode 242 is formed on the substrate 200 and surrounds each of the trimmed semiconductor material layer 225. The gate electrode 242 may be formed from any suitable gate electrode material known in the art. The gate electrode material is deposited using any suitable deposition process such as atomic layer deposition (ALD) to ensure that gate electrode 242 is formed around and between each of the trimmed semiconductor material layers 225. The resultant device formed using the method described herein is a horizontal gate all around device, in accordance with an embodiment of the present disclosure. Some embodiments of the disclosure are directed to horizontal gate-all-around devices comprising a trimmed semiconductor material layer 225 as a nano-wire or nano-slab in the channel between source and drain regions.

One or more embodiments of the disclosure are directed to methods of forming a semiconductor device. In one or more embodiments, a method of forming a semiconductor device, comprises: selectively etching a superlattice structure comprising a plurality of semiconductor material layers and a corresponding plurality of release layers alternatingly arranged in a plurality of stacked pairs to remove each of the semiconductor material layers or each of the release layers to form a plurality of voids in the superlattice structure and a plurality of semiconductor material layers extending between a source region and a drain region; and trimming the plurality of semiconductor material layers to form trimmed semiconductor material layers.

Figure 3:
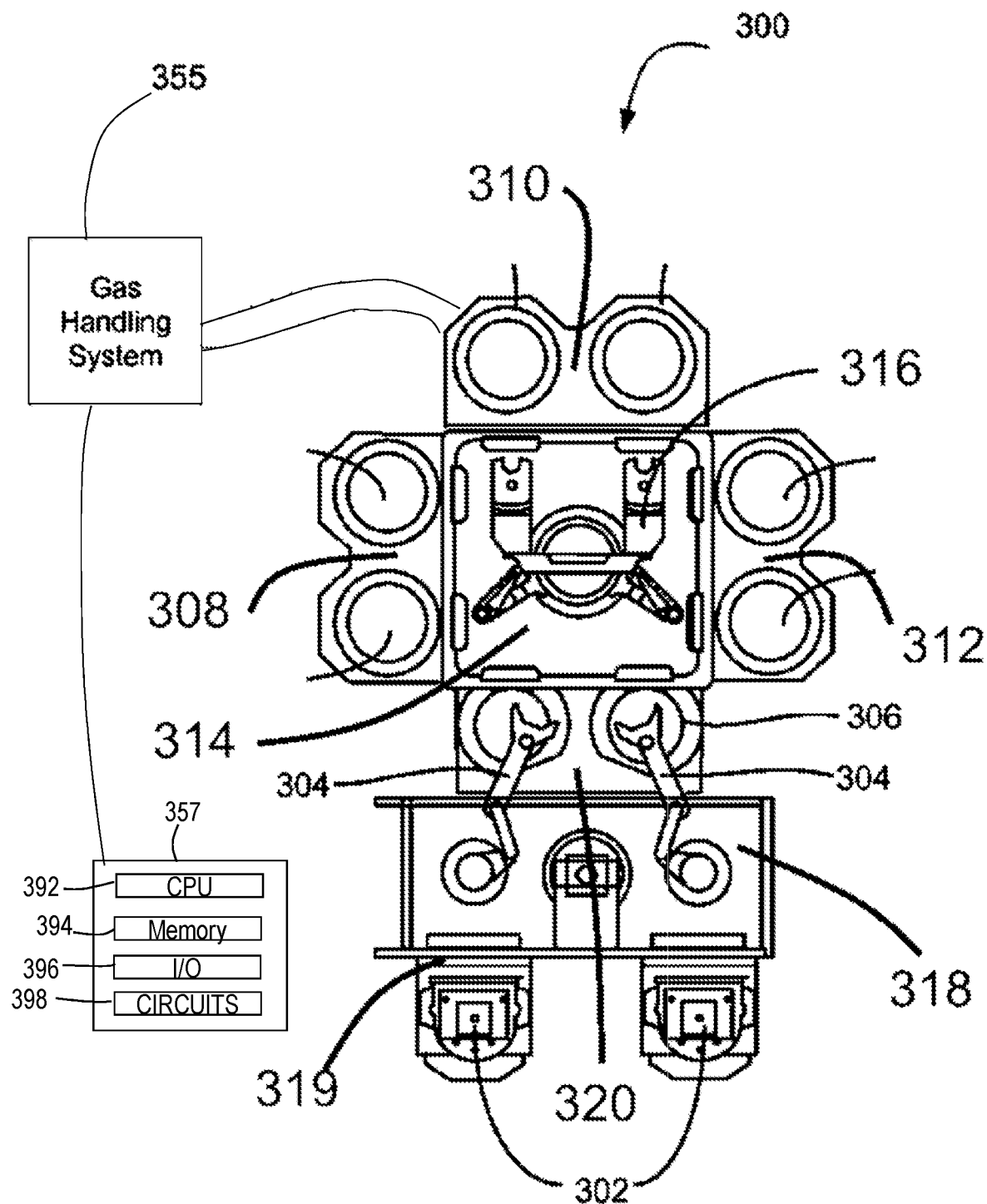
FIG. 3 illustrates a cluster tool according to one or more embodiments.

Additional embodiments of the disclosure are directed to processing tools 300 for the formation of the GAA devices and methods described, as shown in FIG. 3. A variety of multi-processing platforms, including the Centura®, Dual ACP, Producer® GT, and Endura® platform, available from Applied Materials® as well as other processing systems may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a preclean chamber, a deposition chamber, an annealing chamber, an etching chamber, a selective etching chamber, and the like. The particular arrangement of process chambers and components can be varied depending on the cluster tool and should not be taken as limiting the scope of the disclosure.

In some embodiments, the cluster tool 300 includes an isotropic etching chamber for selectively etching/trimming the semiconductor material layers 224. The isotropic etching chamber of some embodiments comprises one or more a fluorine-based dry etching chamber. In some embodiments, the cluster tool 300 includes a pre-cleaning chamber connected to the central transfer station.

In the embodiment shown in FIG. 3, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 357 has a configuration to control the selective isotropic etching chamber to selectively etch the semiconductor material layer 224 to form the trimmed semiconductor material layer 225, on a wafer at a temperature in the range of from about 20° C. to about 300° C. in an atmosphere containing nitrogen trifluoride ($NF_3$), a mixture of nitrogen trifluoride and helium (He) or a similar process chemistry at a pressure in the range of about 0.05 Torr to about 10 Torr.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising an isotropic etching chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, comprising:
    selectively etching a superlattice structure on a substrate, the superlattice structure comprising a plurality of semiconductor material layers and a corresponding plurality of release layers alternatingly arranged in a plurality of stacked pairs, to remove each of the plurality of semiconductor material layers or each of the plurality of release layers to form a plurality of voids in the superlattice structure, the plurality of semiconductor material layers extending between a source region and a drain region;
    pre-cleaning the plurality of semiconductor material layers to remove native oxide and/or residues; and
    trimming the plurality of semiconductor material layers to form a plurality of trimmed semiconductor material layers.

2. The method of claim 1, wherein the trimming of the plurality of semiconductor material layers comprises isotropically etching the plurality of semiconductor material layers.

3. The method of claim 2, wherein the plurality of trimmed semiconductor material layers have a width in a range of from about 3 nm to about 10 nm.

4. The method of claim 1, further comprising forming the source region adjacent a first end of the superlattice structure and the drain region adjacent a second opposing end of the superlattice structure.

5. The method of claim 1, wherein selectively etching the superlattice structure comprises etching the plurality of semiconductor material layers and leaving the plurality of release layers.

6. The method of claim 1, wherein trimming the plurality of semiconductor material layers increases a width of the plurality of voids from a first void width to a second void width.

7. The method of claim 6, wherein the first void width is in a range of from about 5 nm to about 15 nm.

8. The method of claim 6, wherein the second void width is in a range of from about 6 nm to about 20 nm.

9. The method of claim 1, further comprising forming a mask on the substrate to expose the plurality of semiconductor material layers in a portion of the substrate prior to the trimming.

10. The method of claim 9, further comprising removing the mask after the trimming the plurality of semiconductor material layers.

11. The method of claim 1, wherein the plurality of semiconductor material layers comprise silicon germanium (SiGe) and the plurality of release layers comprise silicon (Si).

12. The method of claim 1, wherein the method is performed in a processing chamber without breaking vacuum.

13. A non-transitory computer readable medium including instructions, that, when executed by a controller of a processing chamber, causes the processing chamber to perform operations of:
    selectively etch a superlattice structure on a substrate, the superlattice structure comprising a plurality of semiconductor material layers and a corresponding plurality of release layers alternatingly arranged in a plurality of stacked pairs, to remove each of the semiconductor material layers or each of the release layers to form a plurality of voids in the superlattice structure, the plurality of semiconductor material layers extending between a source region and a drain region;
    pre-clean the plurality of semiconductor material layers to remove native oxide and/or residues; and
    trim the plurality of semiconductor material layers to form trimmed semiconductor material layers.

14. The non-transitory computer readable medium of claim 13, further including instructions, that, when executed by a controller of a processing chamber, causes the processing chamber to perform further operations of:
    form a mask on the substrate to expose a plurality of semiconductor material layers in a portion of the substrate prior to the trimming.

* * * * *